US012408418B2

(12) United States Patent
Kuroda et al.

(10) Patent No.: US 12,408,418 B2
(45) Date of Patent: Sep. 2, 2025

(54) SEMICONDUCTOR DEVICE AND METHOD OF MANUFACTURING THE SAME

(71) Applicant: RENESAS ELECTRONICS CORPORATION, Tokyo (JP)

(72) Inventors: Ryota Kuroda, Tokyo (JP); Hitoshi Matsuura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 263 days.

(21) Appl. No.: 17/517,920

(22) Filed: Nov. 3, 2021

(65) Prior Publication Data

US 2022/0165727 A1 May 26, 2022

(30) Foreign Application Priority Data

Nov. 20, 2020 (JP) .................................. 2020-193696

(51) Int. Cl.
*H10D 84/60* (2025.01)
*H10D 1/47* (2025.01)
*H10D 12/00* (2025.01)
*H10D 12/01* (2025.01)

(52) U.S. Cl.
CPC ............ *H10D 84/615* (2025.01); *H10D 1/47* (2025.01); *H10D 12/038* (2025.01); *H10D 12/481* (2025.01)

(58) Field of Classification Search
CPC ............ H01L 29/7802; H01L 29/7813; H01L 29/7395; H01L 29/7396; H01L 29/7397; H01L 29/7811; H01L 29/7803
See application file for complete search history.

(56) References Cited

U.S. PATENT DOCUMENTS

| 6,674,126 B2 * | 1/2004 | Iwamoto ............ H01L 29/7811 |
| | | 257/329 |
| 8,198,697 B2 | 6/2012 | Momota et al. |
| 9,741,838 B2 | 8/2017 | Nishikawa et al. |
| 9,818,853 B2 | 11/2017 | Matsuura |
| 10,026,833 B2 | 7/2018 | Tanaka |
| 10,490,419 B2 | 11/2019 | Horie et al. |
| 10,529,813 B2 | 1/2020 | Sagawa et al. |
| 10,529,846 B2 | 1/2020 | Moriya et al. |
| 10,680,072 B2 | 6/2020 | Nakanishi |

(Continued)

FOREIGN PATENT DOCUMENTS

| JP | 2011-003728 A | 1/2011 |
| JP | 2015-95578 A | 5/2015 |

(Continued)

OTHER PUBLICATIONS

Office Action dated on Mar. 19, 2024 issued in the corresponding Japanese Patent Application No. 2020-193696, w/English Translation.

(Continued)

*Primary Examiner* — Jesse Y Miyoshi
(74) *Attorney, Agent, or Firm* — Rimon P.C.

(57) ABSTRACT

A built-in resistor electrically connecting a trench gate electrode and a gate pad is formed of a conductive film formed on a semiconductor substrate via an insulating film. Here, a film thickness of the insulating film is larger than a film thickness of an insulating film in a trench and is smaller than an insulating film which is a field oxide film.

8 Claims, 14 Drawing Sheets

(56) References Cited

U.S. PATENT DOCUMENTS

| | | | | |
|---|---|---|---|---|
| 2001/0023957 A1* | 9/2001 | Warwick | ............ | H01L 29/7397 |
| | | | | 257/E29.027 |
| 2006/0091457 A1* | 5/2006 | Kobayashi | .......... | H01L 29/7813 |
| | | | | 257/E29.136 |
| 2008/0290367 A1* | 11/2008 | Su | ...................... | H01L 29/7811 |
| | | | | 438/380 |
| 2013/0092976 A1* | 4/2013 | Hsieh | .................. | H01L 27/0629 |
| | | | | 257/133 |
| 2018/0286955 A1 | 10/2018 | Kawamura | | |
| 2021/0384190 A1 | 12/2021 | Umeki | | |

FOREIGN PATENT DOCUMENTS

| | | |
|---|---|---|
| JP | 2016-58466 A | 4/2016 |
| JP | 2017-041547 A | 2/2017 |
| JP | 2017-135245 A | 8/2017 |
| JP | 2017-143136 A | 8/2017 |
| JP | 2018-041789 A | 3/2018 |
| JP | 2018-170425 A | 11/2018 |
| JP | 2019-33151 A | 2/2019 |
| JP | 2019-62031 A | 4/2019 |
| JP | 2019-161181 A | 9/2019 |
| JP | 2020-77756 A | 5/2020 |
| WO | 2020/080476 A1 | 4/2020 |

OTHER PUBLICATIONS

Office Action dated Oct. 15, 2024, from corresponding Japan Patent Application No. 2020-193696, 8 pages.

\* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2020-193696 filed on Nov. 20, 2020 including the specification, drawings and abstract is incorporated herein by reference in its entirety.

BACKGROUND

The present invention relates to a semiconductor device and a method of manufacturing the same, and particularly relates to a technology effectively applied to an IGBT.

In an IGBT (Insulated Gate Bipolar Transistor) which is a kind of power semiconductor, a built-in resistor made of, for example, a polysilicon film has been known as a built-in element between a gate pad and a gate electrode.

Patent Document 1 (Japanese Unexamined Patent Application Publication No. 2017-41547) describes that a polysilicon film integrated with a trench gate electrode of an IGBT is formed on an upper surface of a semiconductor substrate.

THERE ARE DISCLOSED TECHNIQUES LISTED BELOW

[Patent Document 1] Japanese Unexamined Patent Application Publication No. 2017-41547

SUMMARY

It is conceivable that a built-in resistor is integrally formed with a polysilicon film constituting a trench gate electrode. In this case, the insulating film under the built-in resistor is composed of the same oxide film as the trench gate insulating film (that is, the oxide film formed by the same process as the gate oxide film) and thus has a relatively thin oxide film structure. Therefore, it is feared that the dielectric breakdown occurs between the built-in resistor and the semiconductor substrate. On the other hand, if this oxide film is thickened, the trench gate insulating film is also thickened, so that electric field cannot be applied to the p type channel region near the trench gate electrode, which causes the problem in the operation as an IGBT.

The other object and the novel feature will be apparent from the description of this specification and accompanying drawings.

An outline of the typical embodiment disclosed in this application will be briefly described as follows.

In a semiconductor device according to an embodiment, a built-in resistor which electrically connects a trench gate electrode and a gate pad is formed of a conductive film formed on a semiconductor substrate via an insulating film. Here, a film thickness of the insulating film is larger than that of a trench gate insulating film and is smaller than that of a field oxide film.

According to an embodiment disclosed in this application, it is possible to improve the reliability of the semiconductor device.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference signs throughout the drawings for describing the embodiments, and the repetitive description thereof will be omitted. In addition, the description of the same or similar portions is not repeated in principle unless particularly required in the following embodiments.

<Room for Improvement>

Figure 14:
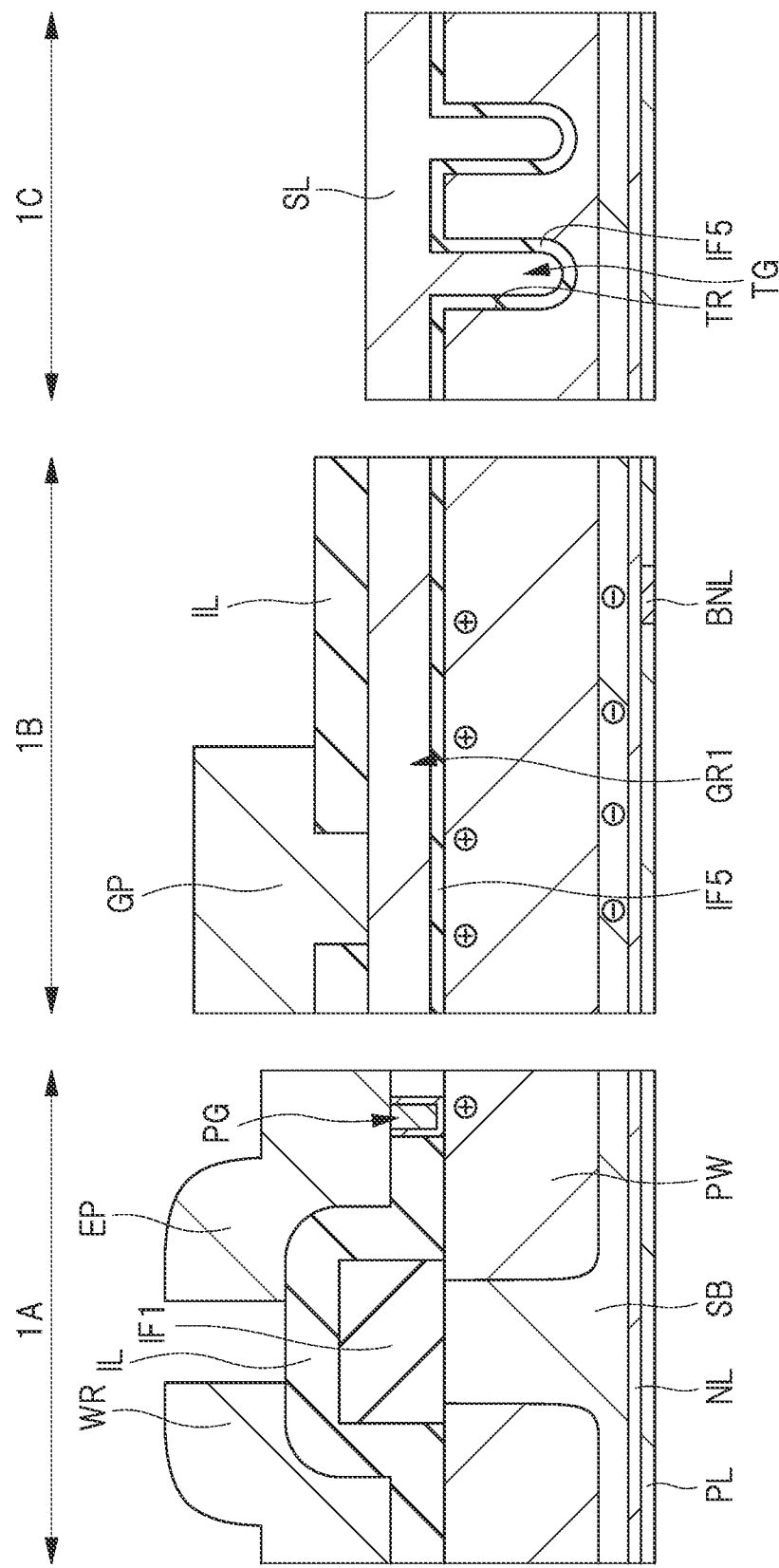
FIG. 14 is a cross-sectional view showing a semiconductor device according to a comparative example.

A room for improvement in a semiconductor device according to a comparative example will be described with reference to FIG. 14. FIG. 14 is a cross-sectional view showing the semiconductor device according to the comparative example.

The semiconductor device according to the comparative example includes an IGBT (Insulated Gate Bipolar Transistor). As shown in FIG. 14, the semiconductor chip constituting the semiconductor device according to the comparative example has a first region 1A, a second region 1B, and a third region 1C, and the first region 1A, the second region 1B, and the third region 1C are shown in order from the left side in FIG. 14. The first region 1A is a region including a peripheral region that surrounds the second region 1B and the third region 1C in a plan view. FIG. 14 does not show an element region that functions as an IGBT.

The semiconductor device according to the comparative example includes an n type semiconductor substrate SB, a p type well PW formed in an upper surface of the semiconductor substrate SB, an n type semiconductor layer NL formed in the vicinity of a lower surface of the semiconductor substrate SB inside the semiconductor substrate SB, and a p type semiconductor layer PL formed from a lower surface of the n type semiconductor layer NL to the lower surface of the semiconductor substrate SB. In the third region 1C, a trench TR is formed in the upper surface of the semiconductor substrate SB, and a trench gate electrode TG is buried in the trench TR via an insulating film IF5. The trench gate electrode TG is composed of a semiconductor layer SL formed on the semiconductor substrate SB. In the second region 1B, the semiconductor layer SL is formed via the insulating film IF5 on the upper surface of the semiconductor substrate SB outside the trench TR, and the semiconductor layer SL in the second region 1B constitutes a built-in resistor GR1. Namely, each of the built-in resistor GR1 and the trench gate electrode TG is a part of one semiconductor layer SL, and the film thickness of the insulating film IF5 under each of the built-in resistor GR1 and the trench gate electrode TG is substantially uniform.

An emitter pad EP which supplies an emitter potential to an emitter region of the IGBT is formed on the semiconductor substrate SB in the first region 1A. Further, a gate pad GP which supplies a gate potential to the trench gate electrode TG through the built-in resistor GR1 is connected to an upper surface of the built-in resistor GR1 in the second region 1B. Here, the p type semiconductor layer PL is not uniformly formed on a back surface of the semiconductor substrate SB, but an n type semiconductor layer BNL is partially formed as a defect.

The insulating film IF5 is mainly composed of, for example, a TEOS (Tetraethyl orthosilicate) film, and its film thickness is, for example, about 110 nm. Specifically, a TEOS film of 110 nm is formed on a thermal oxide film having a film thickness of, for example, 10 nm, and the insulating film IF5 having a total thickness of 110 nm is formed.

In the structure of this comparative example, a high collector voltage is applied at a relatively high rate in some cases (for example, dV/dt>10 kV/μs) when the IGBT switches from an off-state to an on-state. At this time, a high electric field is applied to the insulating film IF5 located between the p type well PW connected to the emitter potential and the built-in resistor GR1, and the insulating film IF5 is broken in some cases. In particular, when a defect is introduced in the process of forming the structure on the back surface side in the process of forming the IGBT and the n type semiconductor layer BNL which is the defect is formed in a part of the p type semiconductor layer PL on the back surface, the dielectric breakdown of the insulating film IF5 occurs more frequently.

When the IGBT is in an off-state, a bias voltage of a freewheeling diode connected in parallel with the IGBT is applied to the collector voltage of the IGBT. When this voltage is applied, a parasitic body diode inside the IGBT operates, holes are supplied from the emitter electrode on the semiconductor substrate SB, and electrons are supplied from a collector electrode on the back surface of the semiconductor substrate SB, so that carriers exist inside the IGBT (see FIG. 14). The parasitic body diode is, for example, a diode formed by the PN junction between an n type layer composed of the n type semiconductor substrate SB and the n type semiconductor layer NL and the p type well shown in the second region 1B of FIG. 14.

If the collector voltage is applied at a high dV/dt when the IGBT transitions to the on-state in the state where the carriers exist in the semiconductor substrate SB as described above, the remaining carriers are discharged. Specifically, the holes in the p type well PW are discharged through the emitter pad (emitter electrode) EP, and the electrons in the semiconductor substrate SB are discharged through the n type semiconductor layer NL. Impact ionization occurs in the semiconductor substrate SB under the built-in resistor GR1 due to the discharge of the remaining carriers, and the voltage drop occurs due to the sweeping out of the carriers generated thereby. As a result, a high electric field is generated in the semiconductor substrate SB. At this time, if the insulating film IF5 under the built-in resistor GR1 is as thin as the trench gate insulating film as in the comparative example, the electric field of the insulating film IF5 in the second region 1B reaches the breakdown electric field, resulting in the breakdown of the insulating film IF5 under the built-in resistor GR1.

The insulating film IF5 between the built-in resistor GR1 and the p type well PW connected to the emitter potential is a portion where a potential difference does not occur in a normal state, that is, in static properties other than when the collector voltage or the like transitions. Therefore, the occurrence of such breakdown has not been assumed. As described above, the inventors have found the first room for improvement that, even in a place where the potential difference does not occur in static properties, the potential difference occurs under the situation of transient operation and the dielectric breakdown occurs due to the high electric field.

Also, the thermal oxide film constituting the gate trench insulating film is preferably formed to be thicker because it has a denser structure and is more reliable than the TEOS film. Further, it is preferable that the thermal oxide film is formed to be thicker because the variation in film formation can be reduced. However, when the thermal oxide film is thick, the thermal oxide film covering the upper surface of the semiconductor substrate SB next to the trench TR is also thick. If the thermal oxide film that continuously covers the corners of the semiconductor substrate SB, which are the upper ends of the trench TR, is formed to be thick in this way, there arises a problem that the corners tend to be sharpened. Accordingly, there is the second room for improvement that when the thermal oxide film is thickened, the dielectric breakdown is likely to occur between the thermal oxide film and the conductive layer SL covering the corners due to the concentration of the electric field at the corners.

<Layout Configuration Example of Semiconductor Chip>

Figure 1:
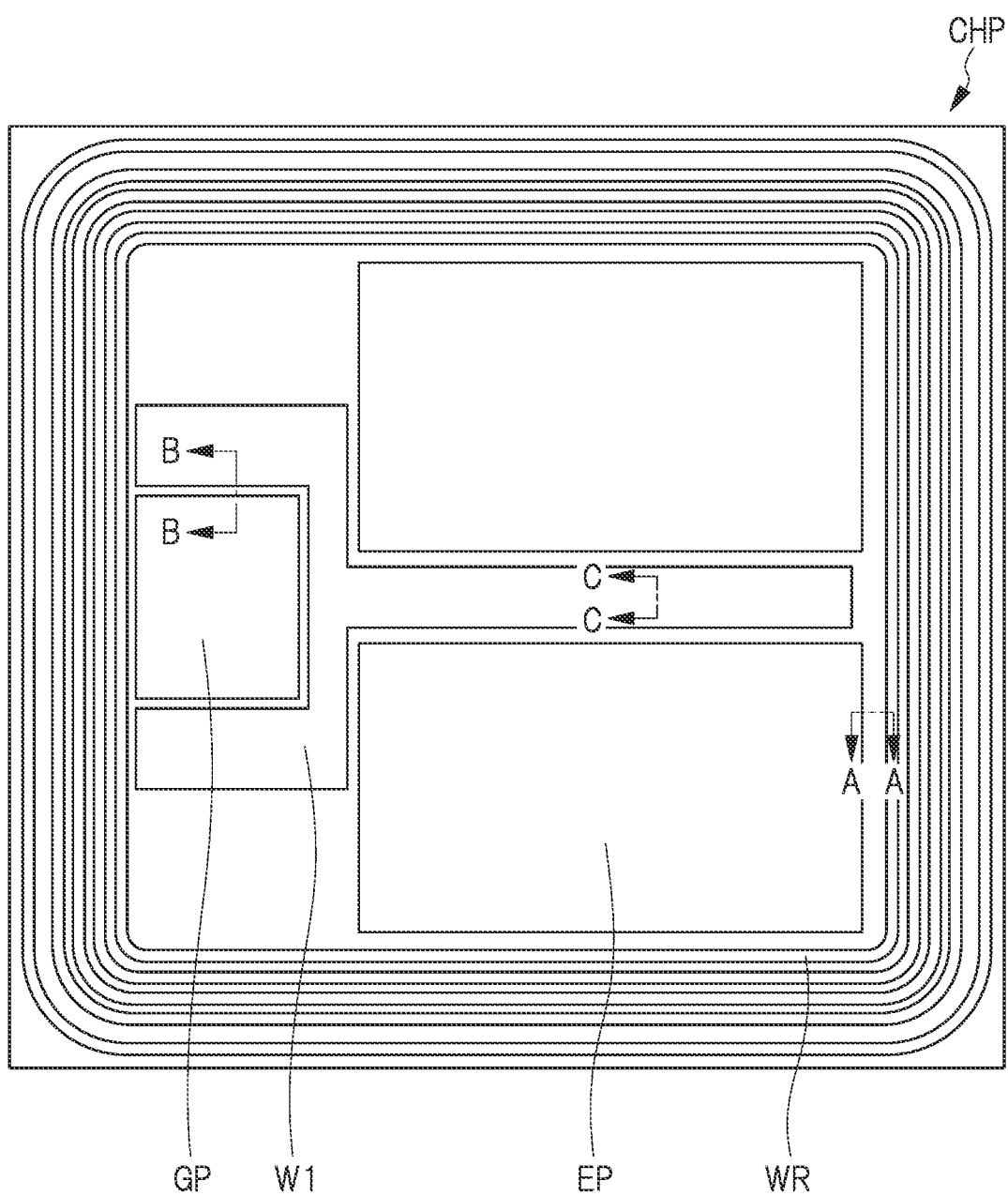
FIG. 1 is a schematic diagram showing a layout configuration of a semiconductor chip in which a semiconductor device according to an embodiment of the present invention is mounted.
Figure 2:
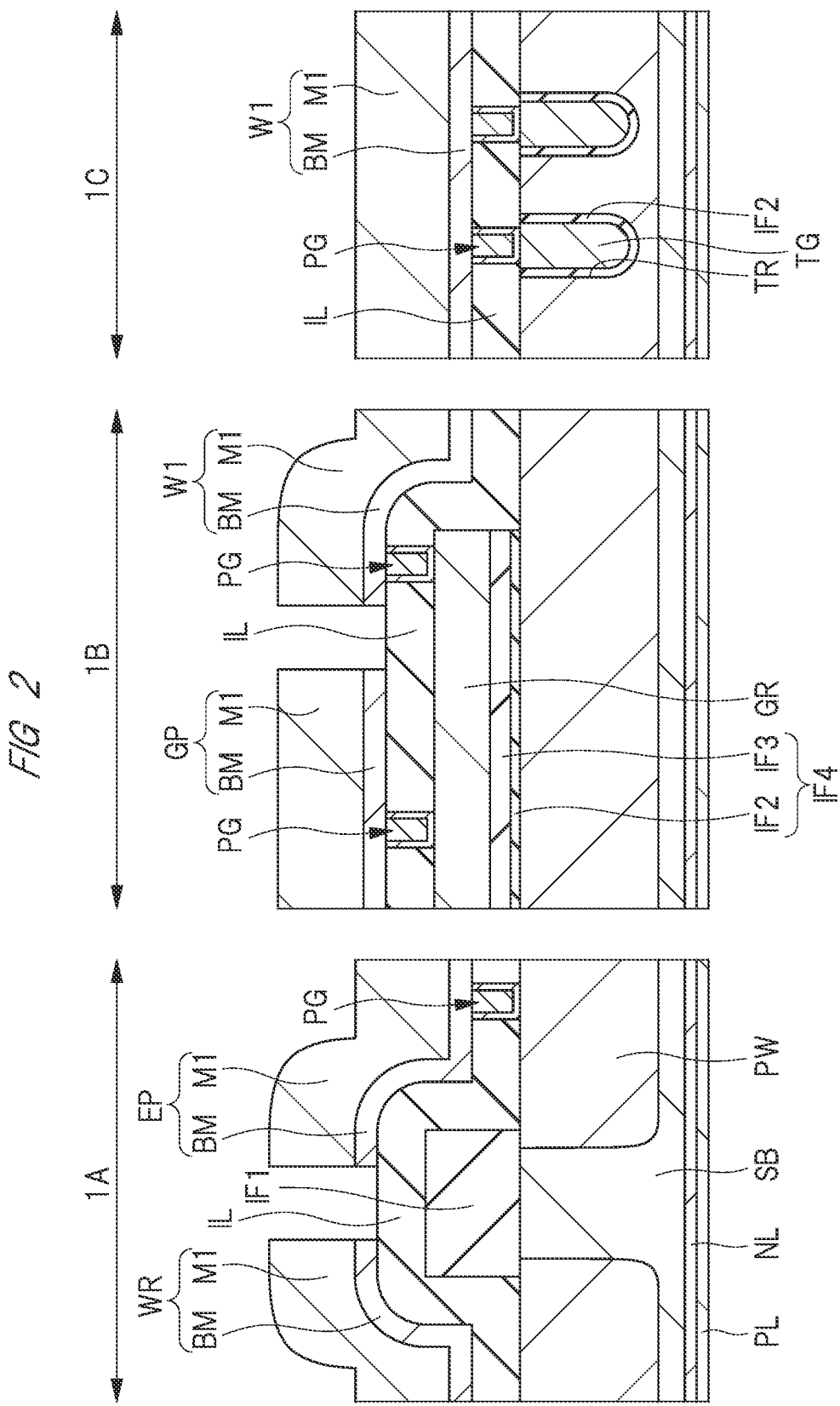
FIG. 2 is a cross-sectional view showing the semiconductor device according to the embodiment of the present invention.

The semiconductor device having the IGBT according to the present embodiment will be described with reference to FIG. 1 and FIG. 2. FIG. 1 is a schematic diagram showing a layout configuration example of a semiconductor chip in which the semiconductor device according to the present embodiment is mounted. FIG. 2 is a cross-sectional view showing the semiconductor device according to the present embodiment.

As shown in FIG. 1, a semiconductor chip CHP according to the present embodiment has a rectangular planar shape. The semiconductor chip CHP includes the gate pad GP, a gate wiring W1, and the emitter pad EP in a plan view. Also, a collector electrode (not shown in FIG. 1 and FIG. 2) covering a lower surface of the semiconductor substrate is formed on a lower surface (back surface) opposite to the upper surface of the semiconductor chip CHP. On the upper surface side of the semiconductor chip CHP, an annular peripheral region surrounding the gate pad GP, the gate wiring W1, and the emitter pad EP and formed along the outline of the semiconductor chip CHP in a plan view is present. For example, the FLR (Field Limiting Ring) which is a termination structure is formed on the upper surface of the semiconductor substrate in the peripheral region. In addition, an annular wiring WR is formed on the semiconductor substrate in the peripheral region.

FIG. 2 shows the first region 1A, the second region 1B, and the third region 1C in order from the left side. The cross-section of the first region 1A shown in FIG. 2 is the cross-section along the line A-A in FIG. 1, the cross-section of the second region 1B is the cross-section along the line B-B in FIG. 1, and the cross-section of the third region 1C is the cross-section along the line C-C in FIG. 1. The first region 1A is the region including the peripheral region surrounding the second region 1B and the third region 1C in a plan view. In FIG. 2, an element region (cell region) functioning as an IGBT is not shown.

The semiconductor device includes the n$^-$ type semiconductor substrate SB and the p type well PW formed from the upper surface of the semiconductor substrate SB to a predetermined depth of the semiconductor substrate SB. The p type well PW is a semiconductor region formed over the first region 1A, the second region 1B, and the third region 1C. Further, the semiconductor substrate SB includes the n type semiconductor layer NL formed in the vicinity of the lower surface of the semiconductor substrate SB so as to be separated from the lower end of the p type well PW and having an impurity concentration higher than that of the semiconductor substrate SB and the p type semiconductor layer PL formed from the lower surface of the n type semiconductor layer NL to the lower surface of the semiconductor substrate SB. Namely, the semiconductor substrate SB includes the p type semiconductor layer PL, the n type semiconductor layer NL, the semiconductor substrate SB, and the p type well PW formed in order from the lower surface side. In the first region 1A, an insulating film IF1 which is an annular field oxide film is formed on the semiconductor substrate SB, and the p type well PW is not formed directly under the insulating film IF1.

The semiconductor substrate SB is made of single crystal Si (silicon) into which an n type impurity such as P (phosphorus) is introduced. The n type semiconductor layer NL is a semiconductor region formed by introducing an n type impurity (for example, P (phosphorus)) into the semiconductor substrate SB. The n type semiconductor layer NL functions as a buffer layer of the IGBT. The p type semiconductor layer PL and the p type well PW are semiconductor regions formed by introducing a p type impurity (for example, B (boron)) into the semiconductor substrate SB. The p type semiconductor layer PL is a layer for injecting holes into the semiconductor substrate SB.

In the third region 1C, the trench TR is formed in the upper surface of the semiconductor substrate SB, and the trench gate electrode TG is buried in the trench TR via an insulating film IF2. Here, the depth of the trench TR is smaller than that of the p type well PW, and the lower end of the trench TR does not reach the lower end of the p type well PW. The trench gate electrode TG is composed of a polysilicon film buried in the trench TR via the insulating film IF2 which is a trench gate insulating film. For example, P (phosphorus) is introduced into the polysilicon film constituting the trench gate electrode TG. Here, the polysilicon film and the insulating film IF2 constituting the trench gate electrode TG are not formed outside the region of the trench TR, that is, on the semiconductor substrate SB in the region that does not overlap the trench TR in a plan view.

In the second region 1B, the built-in resistor GR is formed on the upper surface of the semiconductor substrate SB via an insulating film IF4. The built-in resistor GR is formed directly above the p type well PW. In other words, the built-in resistor GR overlaps the p type well PW in a plan view. The insulating film IF4 is composed of the insulating film IF2 and an insulating film IF3 which are sequentially stacked on the semiconductor substrate SB. The insulating film IF2 is composed of a thermal oxide film formed in the same process as the insulating film IF2 formed in the trench TR in the third region 1C. Also, the insulating film IF3 is, for example, a TEOS film. Therefore, the film thickness of the insulating film IF4 is larger than the film thickness of the insulating film IF2 in the trench TR. In other words, the thickness of the insulating film between the built-in resistor GR and the upper surface of the semiconductor substrate SB is larger than the thickness of the insulating film between the surface of the trench TR and the trench gate electrode TG. The film thickness of the insulating film IF4 is about 2 to 7 times the film thickness of the insulating film IF5 of the comparative example, and specifically, for example, about 5 times.

Since the trench gate insulating film is formed only of the insulating film IF2, the insulating film IF2 is in contact with each of the surface of the semiconductor substrate SB (the surface of the trench TR) and the surface of the trench gate electrode TG. Here, since the insulating film IF2 which is a trench gate insulating film is composed of a single layer of a thermal oxide film, it is possible to prevent the variation in film thickness of the trench gate insulating film as compared with the case where the trench gate insulating film is formed to have a stacked structure of a thermal oxide film and a TEOS film. In this way, the variation in the threshold voltage Vth of the IGBT can be reduced.

Also, the film thickness of the insulating film IF4 is smaller than the film thickness of the insulating film IF1 which is a field oxide film (field insulating film). This is because it is feared that if the insulating film IF4 thicker than the field oxide film is formed, accurate exposure cannot be performed in the photolithography process and patterning may not be performed normally due to its large film thickness. The insulating film IF2 has a higher relative dielectric constant and a denser structure than the insulating film IF3.

The film thickness of the insulating film IF3 is larger than the film thickness of the insulating film IF4. The film thickness of the insulating film IF4 is, for example, 100 to 700 nm, and it is preferable that the film thickness is, for example, 200 to 400 nm. The film thickness of the insulating film IF2 is, for example, 70 nm or more, and is specifically, for example, 100 nm. Namely, the shortest distance between the surface of the trench TR and the trench gate electrode TG is 70 nm or more. Also, the film thickness of the insulating film IF3 is, for example, about 450 nm. The film thickness of the insulating film IF1 is, for example, about 700 nm. The insulating film IF3 is not limited to the silicon oxide film, and may be composed of, for example, a silicon nitride film. The insulating film IF1 is, for example, an annular pattern made of a silicon oxide film, and surrounds the element region, the second region 1B, the third region 1C, the emitter pad EP, the gate pad GP, and the gate wiring W1 described later in a plan view.

The built-in resistor GR is a resistor made of, for example, a polysilicon film and is made conductive by introducing, for example, As (arsenic). Here, the built-in resistor GR and the trench gate electrode TG are separated from each other. The built-in resistor GR is a resistor element composed of a resistor connected in series between the gate pad GP and the trench gate electrode TG.

The interlayer insulating film IL made of, for example, a silicon oxide film is formed on the semiconductor substrate SB so as to cover the trench gate electrodes TG, the insulating films IF1 to IF4, and the built-in resistor GR. Connection holes penetrating from the upper surface to the lower surface of the interlayer insulating film IL are formed at a plurality of locations in the interlayer insulating film IL, and a plug PG is buried in each of the connection holes. The plug PG is composed of, for example, a TiN (titanium nitride)/Ti (titanium) film which is a barrier metal film that continuously covers the bottom surface and side surface of the connection hole and a W (tungsten) film buried in the connection hole via the barrier metal film. The plugs PG are connected to the upper surface of the p type well PW in the first region 1A, both ends of the upper surface of the built-in resistor GR in the second region 1B, and the upper surface of the trench gate electrode TG. Here, the width of the plug PG is smaller than the width of the trench gate electrode TG in the direction along the upper surface of the semiconductor substrate SB. Therefore, the bottom surface of the plug PG connected to the trench gate electrode TG is separated from the upper surface of the semiconductor substrate SB.

A stacked metal film composed of a metal film BM and a metal film M1 formed on the metal film BM is formed on the interlayer insulating film IL and the plug PG. The metal film BM which is a barrier metal film is made of, for example, a TiW (titanium tungsten) film, and the metal film M1 which is a main conductor film is made of, for example, an AlCu (aluminum copper) film. Also, the metal film M1 may be an AlSi film obtained by adding Si to an Al film. Of the plurality of stacked metal films, the stacked metal film electrically connected to the p type well PW via the plug PG in the first region 1A forms the emitter pad (emitter electrode) EP. Also, of the plurality of stacked metal films, the stacked metal film connected to the upper surface of one end of the built-in resistor GR via the plug PG in the second region 1B forms the gate pad GP. Further, of the plurality of stacked metal films, the stacked metal film connected to the upper surface of the other end of the built-in resistor GR via the plug PG in the second region 1B forms the gate wiring W1. The gate wiring W1 is formed from the second region 1B to the third region 1C. The gate wiring W1 in the third region 1C is electrically connected to the trench gate electrode TG via the plug PG. The gate pad GP and the gate wiring W1 are separated from each other.

As described above, the gate pad GP and the trench gate electrode TG are electrically connected to each other by the plurality of plugs PG, the built-in resistor GR, and the gate wiring W1 connected in series therebetween. Specifically, the gate pad GP and the built-in resistor GR are electrically connected via the plug PG, the built-in resistor GR and the gate wiring W1 are electrically connected via the plug PG, and the gate wiring W1 and the trench gate electrode TG are electrically connected via the plug PG.

The emitter pad EP in the first region 1A is configured to supply an emitter potential to the emitter region of the IGBT. The gate pad GP in the second region 1B is configured to supply a gate potential to the trench gate electrode TG through the built-in resistor GR. The gate potential supplied to the trench gate electrode TG in the third region 1C in this way is supplied to the trench gate electrode of the IGBT formed in the element region (not shown), thereby controlling the operation of the IGBT. The trench gate electrode TG and the p type semiconductor layer (collector region) PL constitute the IBGT.

In the peripheral region surrounding the gate pad GP, the gate wiring W1, and the emitter pad EP in a plan view, the wiring WR made of the above-described stacked film separated from the emitter pad EP is formed.

<Effect of Semiconductor Device>

In the present embodiment, by making the insulating film IF4 directly under the built-in resistor GR thicker than the trench gate insulating film, the transient electric field applied to the insulating film IF4 can be relaxed even if the collector voltage is applied at high dV/dt when the IGBT switches from an off-state to an on-state in the switching operation.

Namely, the electric field can be relaxed by thickening the insulating film to which the electric field is applied. Here, the electric field can be relaxed by forming the insulating film IF4 so as to be thicker than the insulating film IF5 in the comparative example. By this means, the breakdown of the insulating film IF4 can be prevented. Specifically, since the film thickness of the insulating film IF4 is about five times the film thickness of the insulating film IF5 in the comparative example, the electric field can be relaxed to ⅕. Since the insulating film IF2 which is the trench gate insulating film and the insulating film IF4 under the built-in resistor GR are formed as different configurations here, the trench gate insulating film does not become thick even when the insulating film IF4 is made thick. Therefore, it is possible to thicken only the insulating film IF4 directly under the built-in resistor GR as described above. Consequently, the first room for improvement can be solved.

Also, it is conceivable that when the insulating film IF2 which is a thermal oxide film is formed to be relatively thick to about 100 nm, a convex corner (sharp corner) is formed at the corner of the semiconductor substrate SB which is the upper end of the trench TR. When such a corner is formed in the comparative example, the dielectric breakdown is likely to occur at the corner as described as the second room for improvement. On the other hand, in the present embodiment, it is the interlayer insulating film IL that is formed directly above the corner, and the insulating film IF2 is not formed directly above the corner. Also, the polysilicon film for the trench gate electrode TG or the built-in resistor GR is not formed directly above the corner. Namely, each of the trench gate electrode TG and the plug PG connected to the upper surface thereof exposes the upper surface of the semiconductor substrate SB adjacent to the trench TR in the direction along the upper surface of the semiconductor substrate SB. Therefore, it is possible to secure the reliability of the gate electrode. Namely, the second room for improvement can be solved.

<Manufacturing Process of Semiconductor Device>

Hereinafter, the method of manufacturing the semiconductor device according to the present embodiment will be described with reference to FIG. 3 to FIG. 12. FIG. 3 to FIG. 12 are cross-sectional views showing the process of forming the semiconductor device according to the present embodiment. FIG. 3 to FIG. 12 are cross-sectional views showing the same location.

Figure 3:
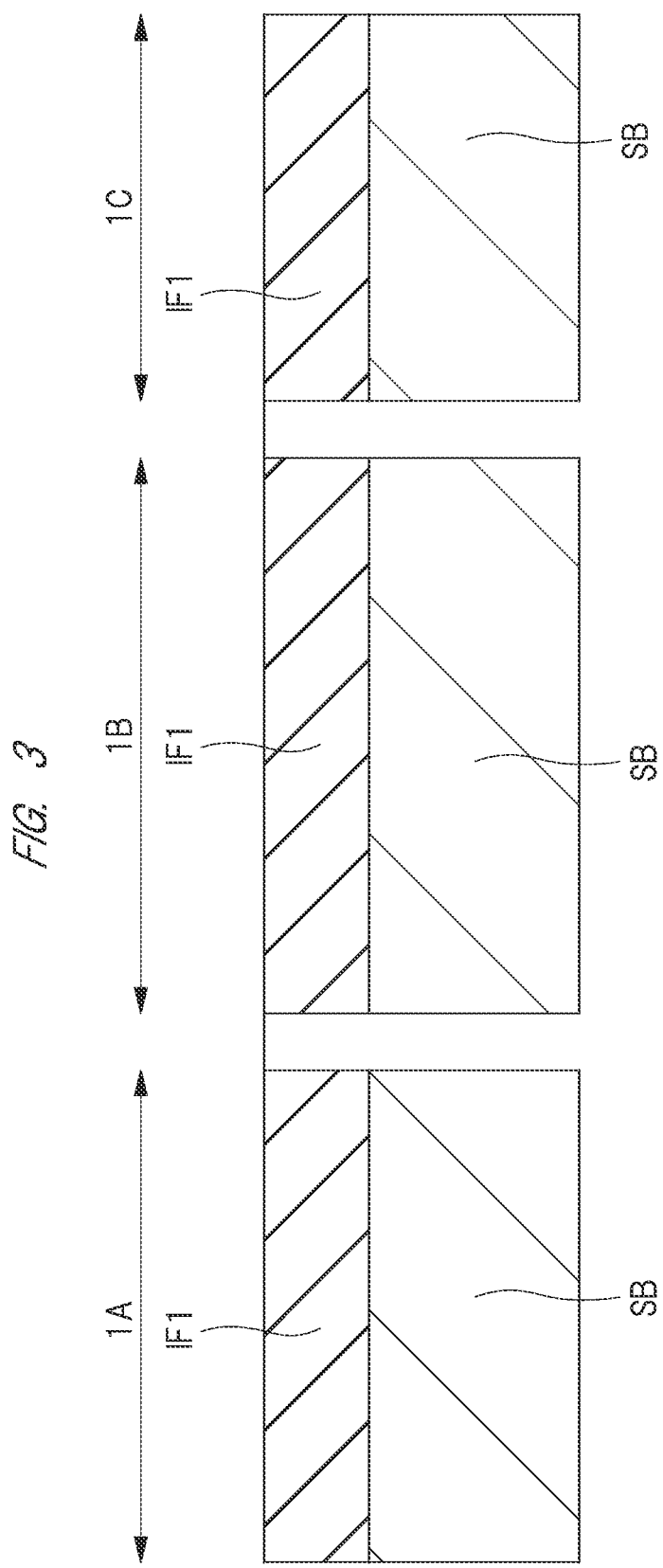
FIG. 3 is a cross-sectional view for describing a manufacturing process of the semiconductor device according to the embodiment of the present invention.

First, as shown in FIG. 3, the semiconductor substrate SB which is a disk-shaped semiconductor wafer is prepared. The semiconductor substrate SB is made of single crystal Si (silicon) into which an n type impurity such as P (phosphorus) is introduced. On the semiconductor substrate SB, chip regions to be cut into the semiconductor chips in a later process are arranged in a matrix in a plan view. Each chip region of the semiconductor substrate SB has the element region in which the IGBT is formed, the second region 1B in which the gate pad and the built-in resistor are formed, and the third region 1C including a power supply path of the trench gate insulating film. Also, each chip region of the semiconductor substrate SB has the annular peripheral region that collectively surrounds the element region, the second region 1B, and the third region 1C in a plan view. The first region 1A is a region including the region in which the emitter pad is formed and the end portion inside the annular peripheral region.

Subsequently, the insulating film IF1 which is a field oxide film is formed on the semiconductor substrate SB. The insulating film IF1 is made of, for example, a silicon oxide film, and can be formed by, for example, the CVD (Chemical Vapor Deposition) method. Here, the insulating film IF1 is initially formed to have a thickness of 950 nm, but the thickness finally becomes about 700 nm by the cleaning or the like in the subsequent manufacturing process.

Figure 4:
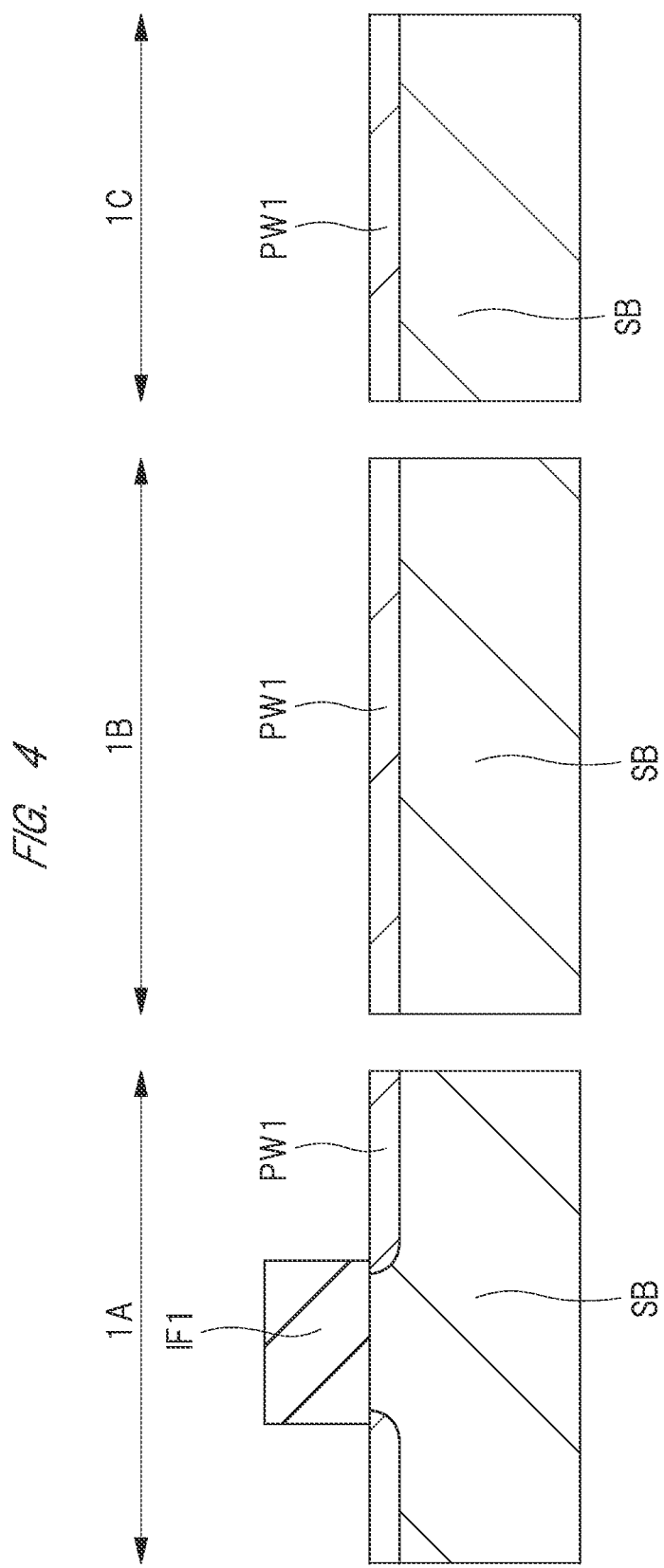
FIG. 4 is a cross-sectional view for describing the manufacturing process of the semiconductor device subsequent to FIG. 3.

Next, as shown in FIG. 4, a part of the insulating film IF1 is removed by the photolithography technique and the dry etching method, thereby exposing a part of the upper surface of the semiconductor substrate SB in the first region 1A and the upper surface of the semiconductor substrate SB in each of the second region 1B and the third region 1C.

Subsequently, a p type impurity (for example, B (boron)) is implanted into the upper surface of the semiconductor substrate SB by the ion implantation method or the like using the insulating film IF1 as a mask (ion implantation blocking mask). In this way, a p type semiconductor region PW1 is formed from the upper surface of the semiconductor substrate SB to a predetermined depth.

Figure 5:
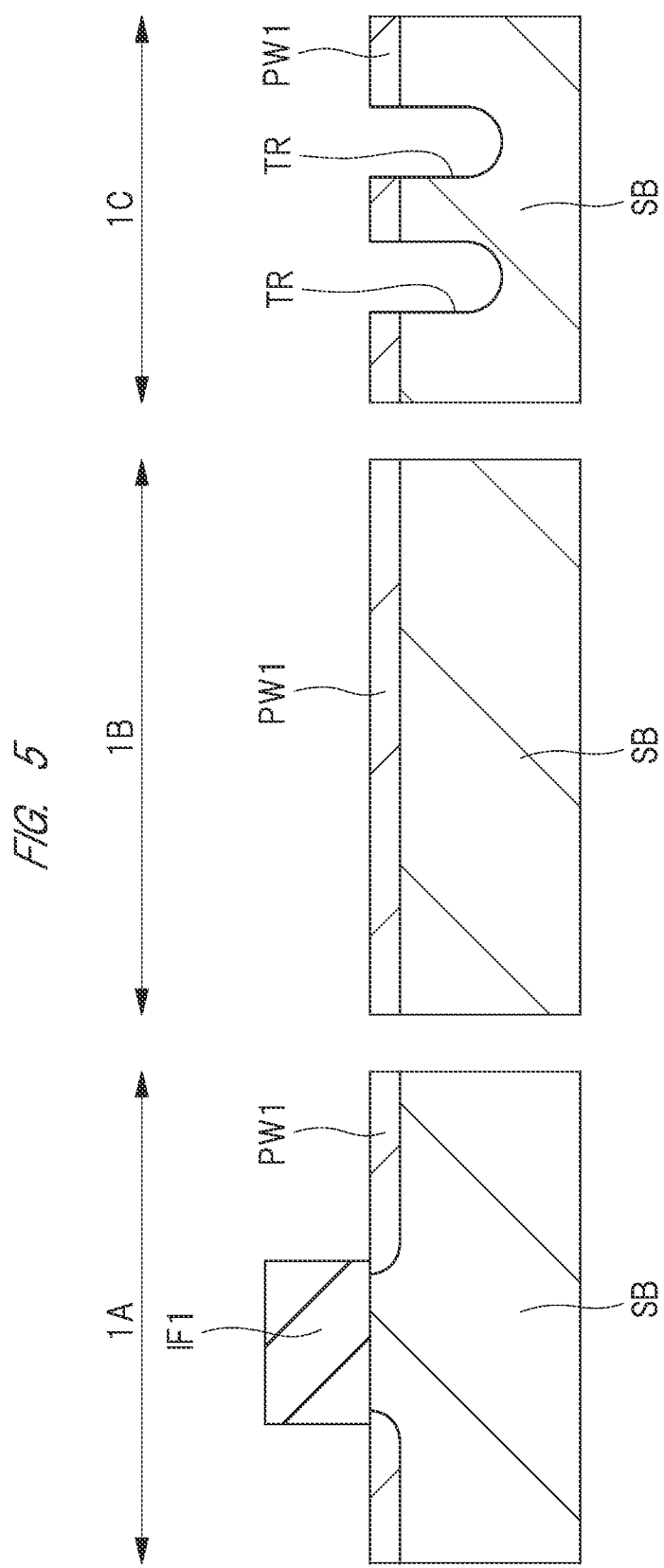
FIG. 5 is a cross-sectional view for describing the manufacturing process of the semiconductor device subsequent to FIG. 4.

Next, as shown in FIG. 5, after forming a TEOS film (not shown) or the like on the semiconductor substrate SB by, for example, the CVD method, the TEOS film is processed by the photolithography technique and the dry etching method, thereby exposing a part of the upper surface of the semiconductor substrate SB in the third region 1C. Subsequently, after forming the plurality of trenches TR having a predetermined depth in the upper surface of the semiconductor substrate SB by the etching method, the TEOS film is removed.

Figure 6:
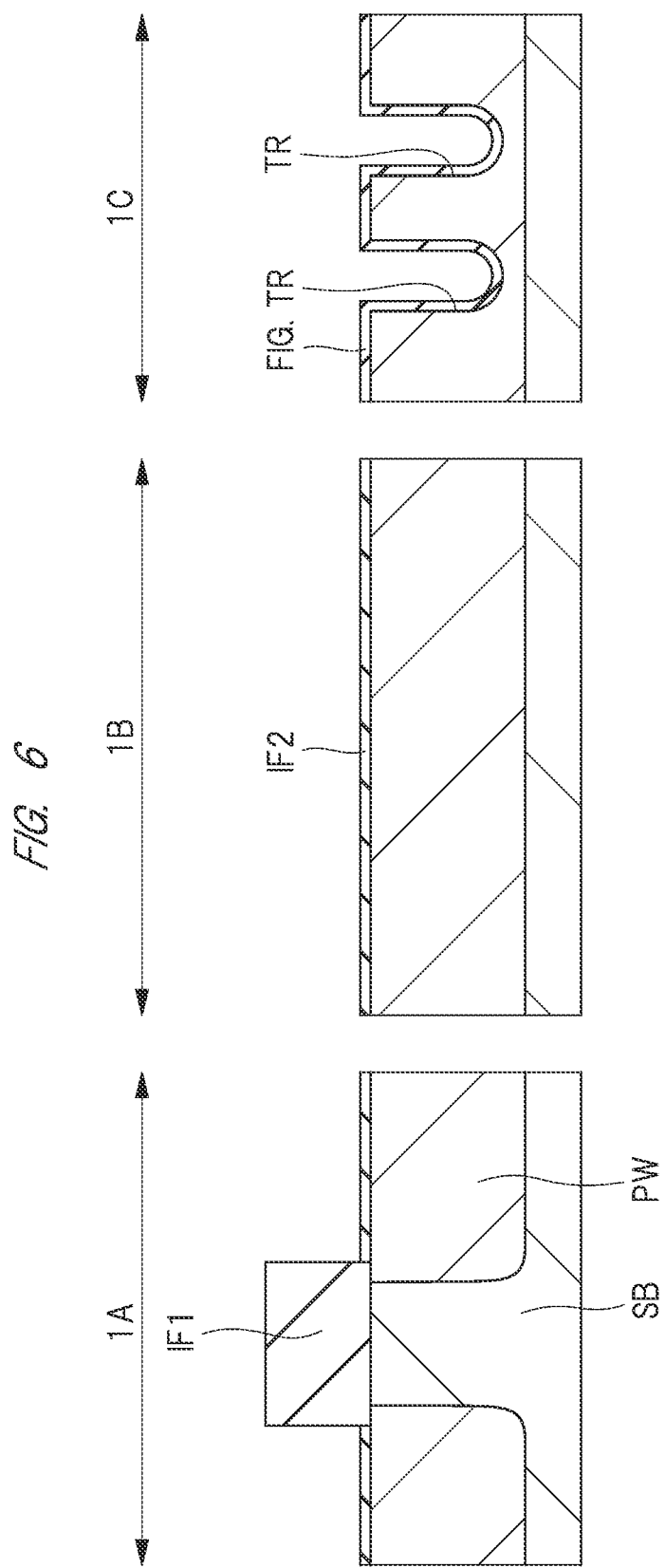
FIG. 6 is a cross-sectional view for describing the manufacturing process of the semiconductor device subsequent to FIG. 5.

Next, as shown in FIG. 6, the impurity introduced to the p type semiconductor region PW1 is diffused by performing the thermal treatment to the semiconductor substrate SB. In this way, the p type well PW having the depth larger than that of the p type semiconductor region PW1 is formed in the semiconductor substrate SB. Subsequently, the insulating film IF2 which is the thermal oxide film covering the surface of the semiconductor substrate SB including the surface of the trench TR is formed by performing the thermal treatment to the semiconductor substrate SB. This oxide film IF2 may be formed as follows. First, after forming a sacrifice oxide film (not shown) by performing the heat treatment at, for example, 1200° C. for about 30 minutes to the semiconductor substrate SB, this sacrifice oxide film is removed by, for example, the wet etching process. Thereafter, the insulating IF2 made of a thermal oxide film is formed by performing the thermal treatment at 950° C. for about 40 minutes to the semiconductor substrate SB again.

Figure 7:
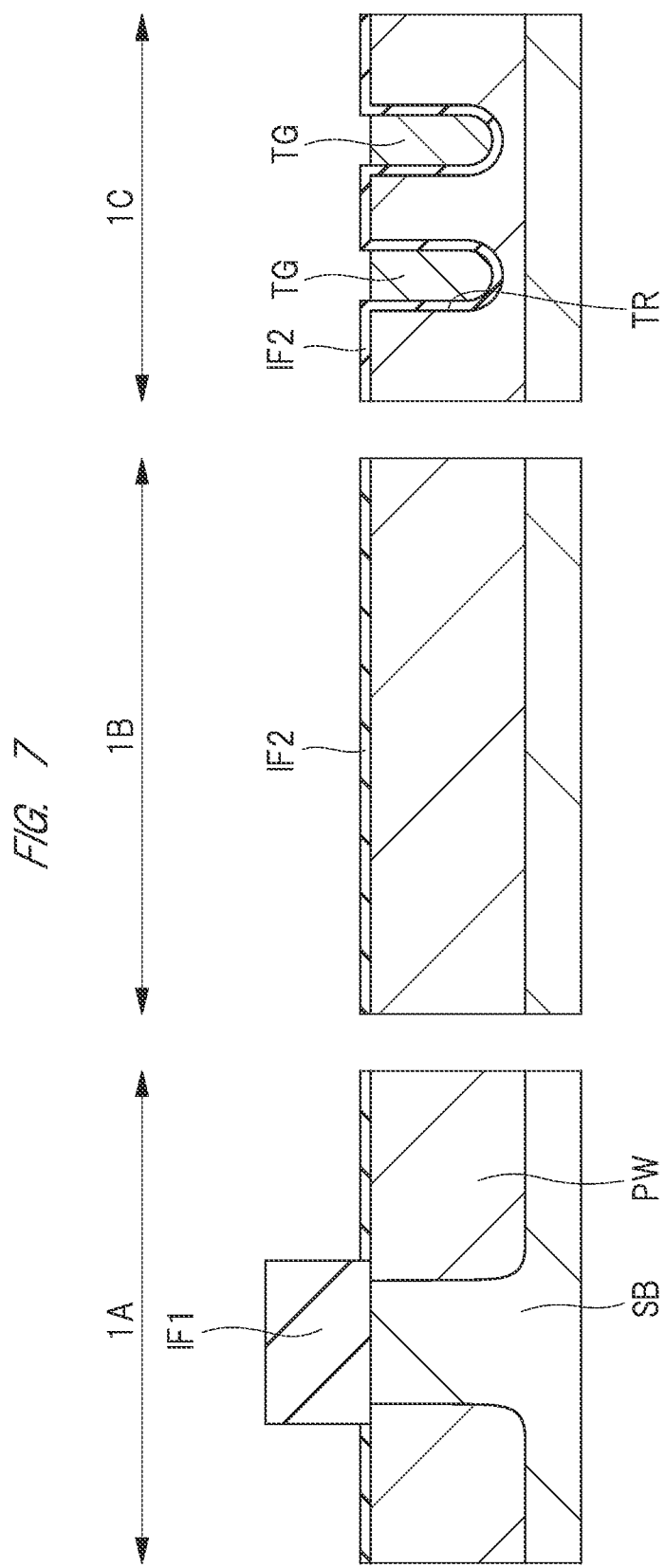
FIG. 7 is a cross-sectional view for describing the manufacturing process of the semiconductor device subsequent to FIG. 6.

Next, as shown in FIG. 7, the trench gate electrode TG buried in the trench TR via the insulating film IF2 is formed. Namely, a polysilicon film (conductive film) is formed on the semiconductor substrate SB including the inside of the trench TR by the CVD method or the like. P (phosphorus) is introduced into this polysilicon film when it is formed. Subsequently, the polysilicon film outside the trench TR is removed by etching back. In this way, the trench gate electrode TG made of the polysilicon film left only in the trench TR is formed.

Figure 8:
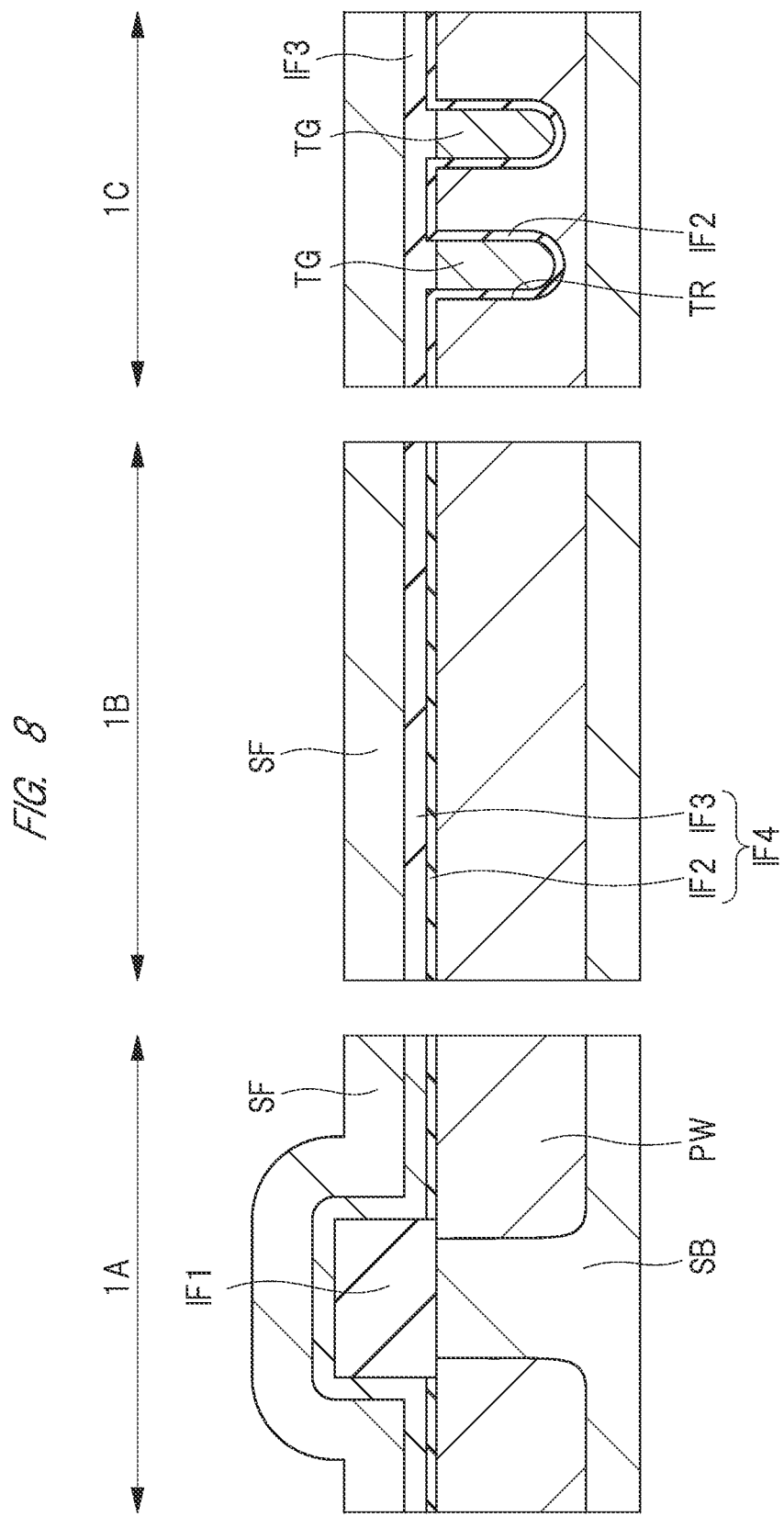
FIG. 8 is a cross-sectional view for describing the manufacturing process of the semiconductor device subsequent to FIG. 7.

Next, as shown in FIG. 8, the insulating film IF3 and a polysilicon film SF are sequentially formed on the semiconductor substrate SB including the upper surface of the trench gate electrode TG by the CVD method or the like. The insulating film IF3 is made of, for example, a TEOS film.

Figure 9:
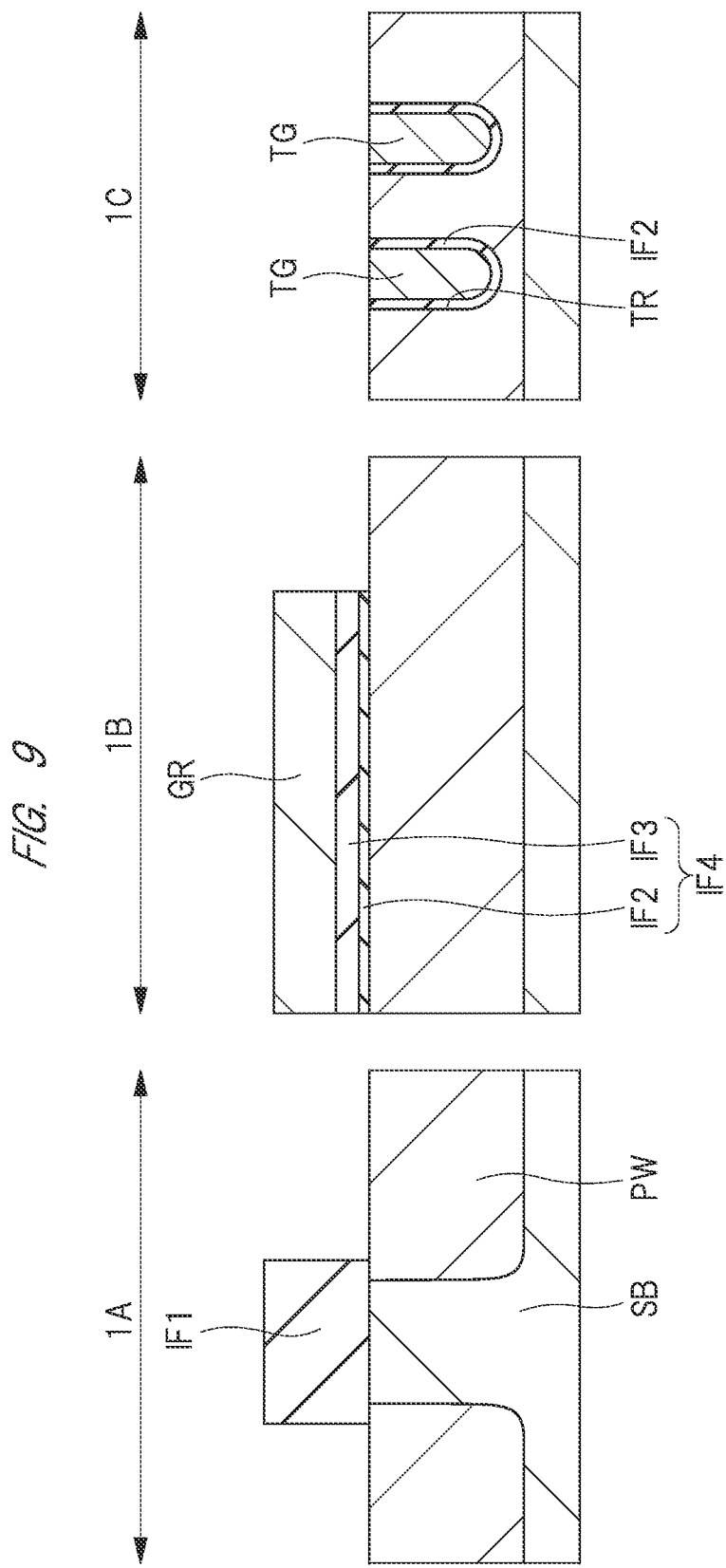
FIG. 9 is a cross-sectional view for describing the manufacturing process of the semiconductor device subsequent to FIG. 8.

Next, as shown in FIG. 9, a part of the stacked film composed of the polysilicon film SF and the insulating films IF3 and IF2 is removed by the photolithography technique and the dry etching method. In this way, a part of the upper surface of the semiconductor substrate SB in each of the first region 1A, the second region 1B, and the third region 1C is exposed. As a result, the built-in resistor GR made of the polysilicon film SF is formed in the second region 1B. As described above, the built-in resistor GR and the trench gate electrode TG are formed in different processes.

Next, though not shown, the channel region and the emitter region are formed in the upper surface of the semiconductor substrate SB in the element region by the photolithography technique and the ion implantation method.

Figure 10:
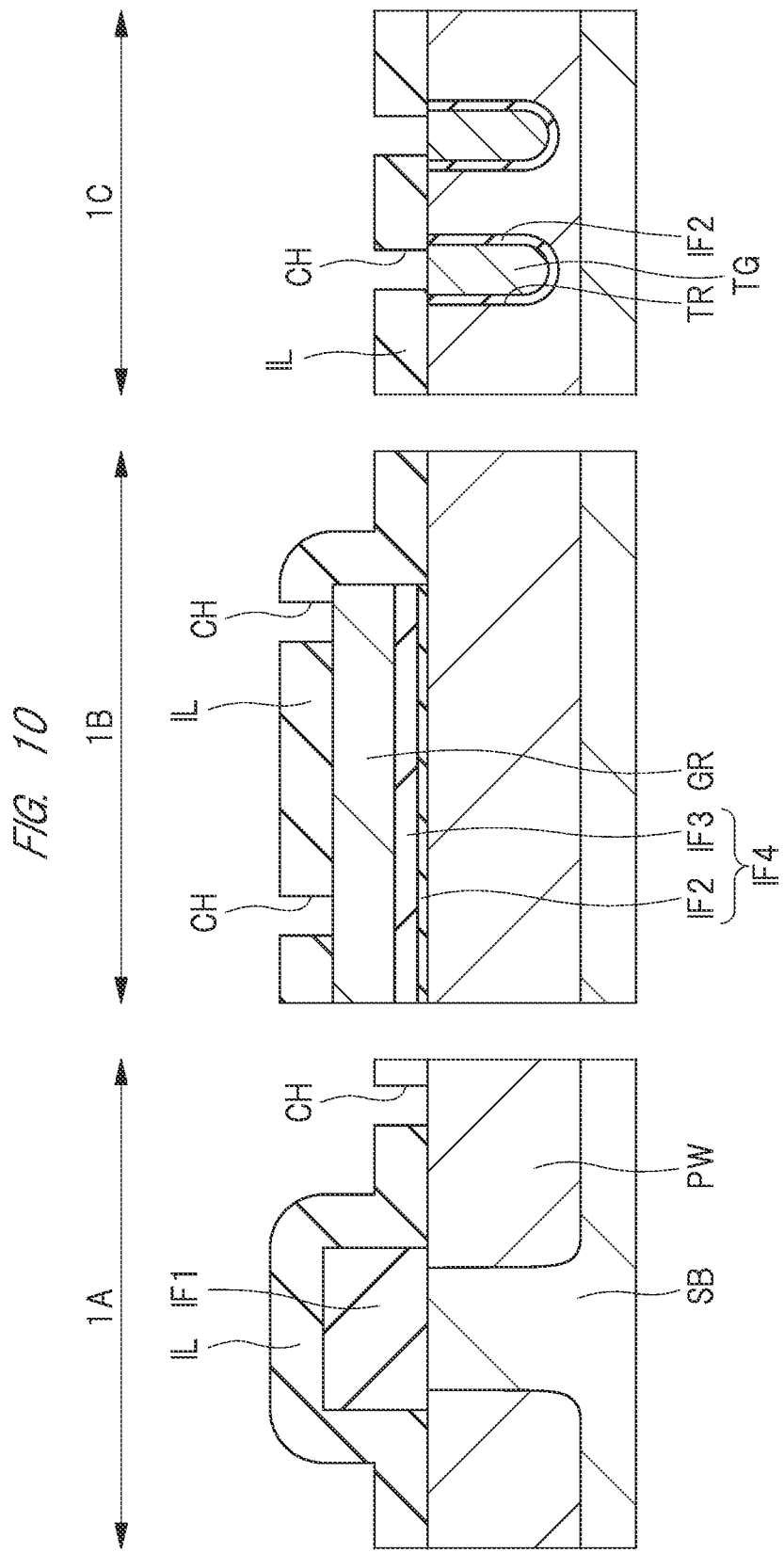
FIG. 10 is a cross-sectional view for describing the manufacturing process of the semiconductor device subsequent to FIG. 9.

Subsequently, as shown in FIG. 10, the interlayer insulating film IL is formed on the semiconductor substrate SB including the upper surfaces of the trench gate electrode TG, the built-in resistor GR, and the insulating film IF1 by the CVD method or the like. The interlayer insulating film IL is made of, for example, a PSG (Phosphorus Silicate Glass) film, that is, a silicon oxide film.

Subsequently, a part of the interlayer insulating film IL is removed by the photolithography technique and the dry etching method. In this way, a plurality of connection holes (openings) which exposes each of the upper surface of the p type well PW in the first region 1A, the upper surfaces of the both ends of the built-in resistor GR in the second region 1B, and the upper surface of the trench gate electrode TG in the third region 1C is formed. Thereafter, though not shown, a body contact region which is a p type semiconductor region is formed by the ion implantation method on the upper surface of the semiconductor substrate SB at the bottom of the connection hole in the element region.

Figure 11:
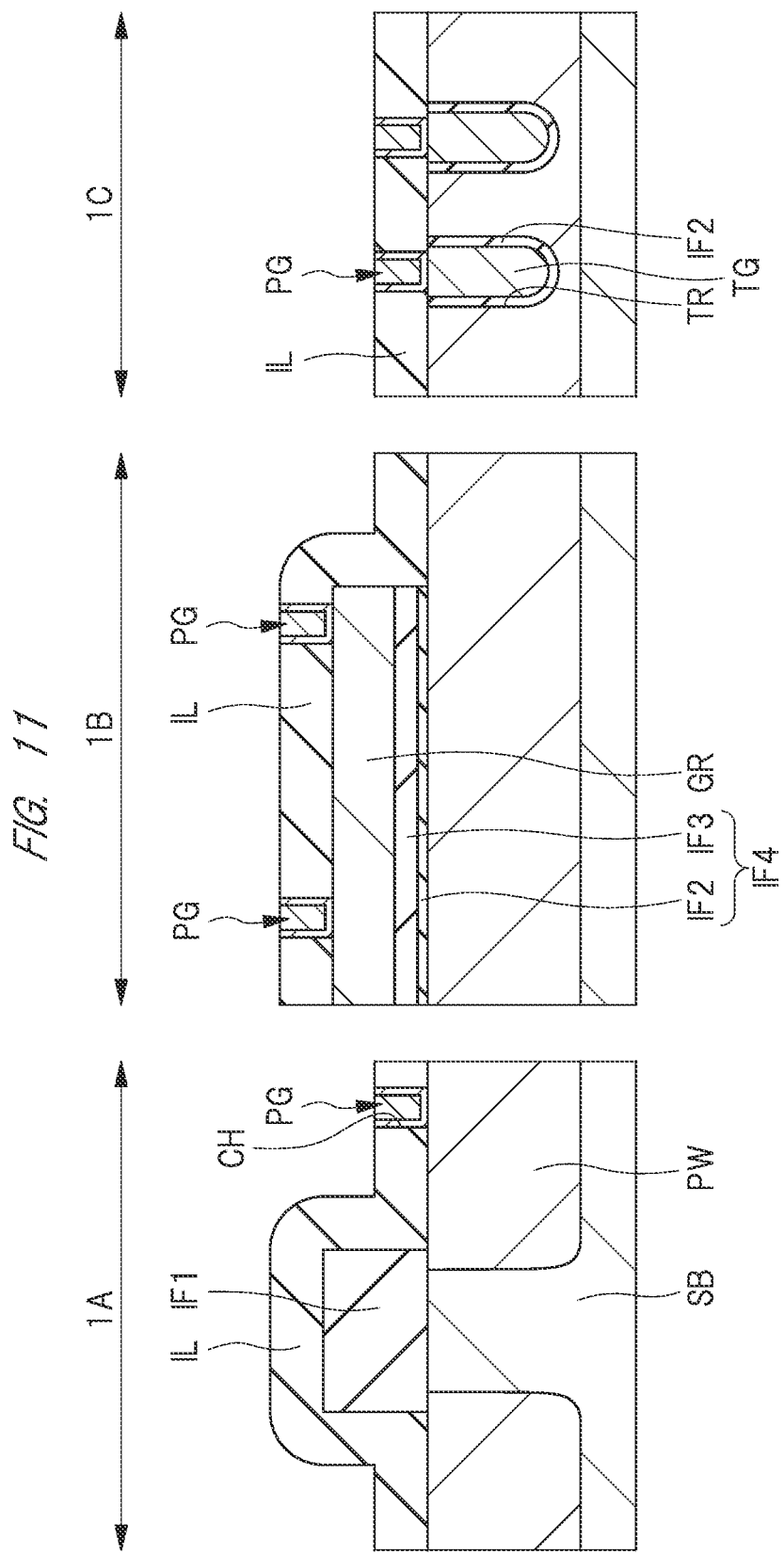
FIG. 11 is a cross-sectional view for describing the manufacturing process of the semiconductor device subsequent to FIG. 10.

Next, as shown in FIG. 11, the plugs PG are formed by filling the inside of each of the plurality of connection holes. Here, the connection holes are completely filled by sequentially forming a TiN (titanium nitride)/Ti (titanium) film which is a barrier metal film and a W (tungsten) film which is a main conductor film on the semiconductor substrate SB (on the interlayer insulating film IL) including the inside of the connection holes by the sputtering method or the like. Thereafter, the plugs PG are formed by removing these metal films formed outside the connection holes by, for example, etching back.

Figure 12:
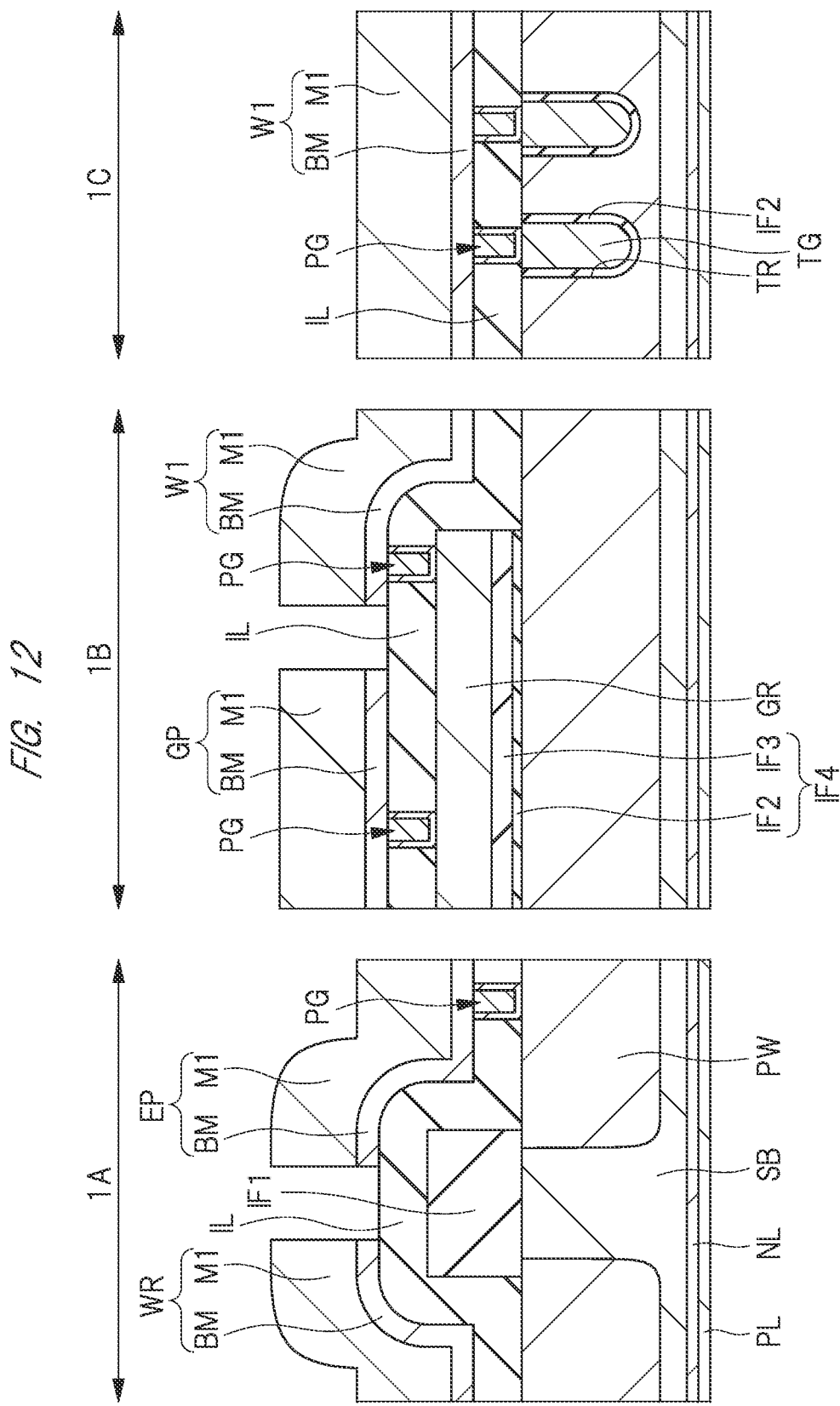
FIG. 12 is a cross-sectional view for describing the manufacturing process of the semiconductor device subsequent to FIG. 11.

Next, as shown in FIG. 12, the metal film BM which is a barrier metal film and the metal film M1 which is a main conductor film are sequentially formed on the semiconductor substrate SB (on the interlayer insulating film IL) including the upper surfaces of the plurality of plugs PG by, for example, the sputtering method. In this way, the stacked metal film which is the stacked film composed of the metal films BM and M1 is formed. The metal film BM is made of, for example, TiW (titanium tungsten) film, and the metal film M1 is made of, for example, an AlCu (aluminum copper) film. Subsequently, the stacked metal film is processed by the photolithography technique and the dry etching method, thereby exposing a part of the upper surface of the interlayer insulating film IL.

Of the plurality of stacked metal films separated from each other in this way, the stacked metal film electrically connected to the p type well PW via the plug PG in the first region 1A forms the emitter pad (emitter electrode) EP. Also, of the plurality of stacked metal films, the stacked metal film connected to the upper surface of one end of the built-in resistor GR via the plug PG in the second region 1B forms the gate pad GP. Further, of the plurality of stacked metal films, the stacked metal film connected to the upper surface of the other end of the built-in resistor GR via the plug PG in the second region 1B forms the gate wiring W1. The gate wiring W1 is formed from the second region 1B to the third region 1C. The gate wiring W1 in the third region 1C is electrically connected to the trench gate electrode TG via the plug PG. The gate pad GP and the gate wiring W1 are separated from each other.

As described above, the gate pad GP and the trench gate electrode TG are electrically connected to each other by the plurality of plugs PG, the built-in resistor GR, and the gate wiring W1 connected in series therebetween. Specifically, the gate pad GP and the built-in resistor GR are electrically connected via the plug PG, the built-in resistor GR and the gate wiring W1 are electrically connected via the plug PG, and the gate wiring W1 and the trench gate electrode TG are electrically connected via the plug PG.

Next, as shown in FIG. 12, the n type semiconductor layer NL is formed by introducing an n type impurity (for example, P (phosphorus)) into the lower surface of the semiconductor substrate SB by the ion implantation method. The n type semiconductor layer NL is separated from the p type well PW and the trench TR. Subsequently, the p type semiconductor layer PL is formed by introducing a p type impurity (for example, B (boron)) into the lower surface of the semiconductor substrate SB by the ion implantation method. The depth of the p type semiconductor layer PL from the lower surface of the semiconductor substrate SB is smaller than the depth of the n type semiconductor layer NL from the lower surface of the semiconductor substrate SB. The p type semiconductor layer PL constitutes the collector region of the IGBT. In this way, the IGBT including at least the trench gate electrode TG, the emitter region (not shown), and the collector region (p type semiconductor layer PL) is formed. Subsequently, though not shown, the collector electrode covering the lower surface of the semiconductor substrate SB is formed.

As described above, the semiconductor device according to the present embodiment is almost completed.

<Effect of Method of Manufacturing Semiconductor Device>

Next, the effect of the method of manufacturing the semiconductor device according to the present embodiment will be described.

In the semiconductor device according to the comparative example shown in FIG. 14, the built-in resistor GR is formed at the same time as the trench gate electrode TG. Therefore, the insulating film under the built-in resistor GR has the same thickness as that of the trench gate insulating film. The trench gate insulating film has a limitation in film thickness in order to normally operate the IGBT. Therefore, in the comparative example, the insulating film under the built-in resistor GR cannot have the thickness larger than a certain thickness, and the dielectric breakdown is likely to occur between the semiconductor substrate SB and the built-in resistor GR.

On the other hand, in the present embodiment, the built-in resistor GR and the trench gate electrode TG are formed in different processes as described above with reference to FIG. 7 to FIG. 9. Therefore, the insulating film IF4 directly under the built-in resistor GR can be formed to be thicker than the trench gate insulating film. Accordingly, even if the collector voltage is applied at a high dV/dt when the IGBT switches from an off-state to an on-state in the switching operation, the transient electric field applied to the insulating film IF4 can be relaxed.

Consequently, it is possible to obtain the same effect as that of the semiconductor device described with reference to FIG. 1 and FIG. 2.

<Modification>

Figure 13:
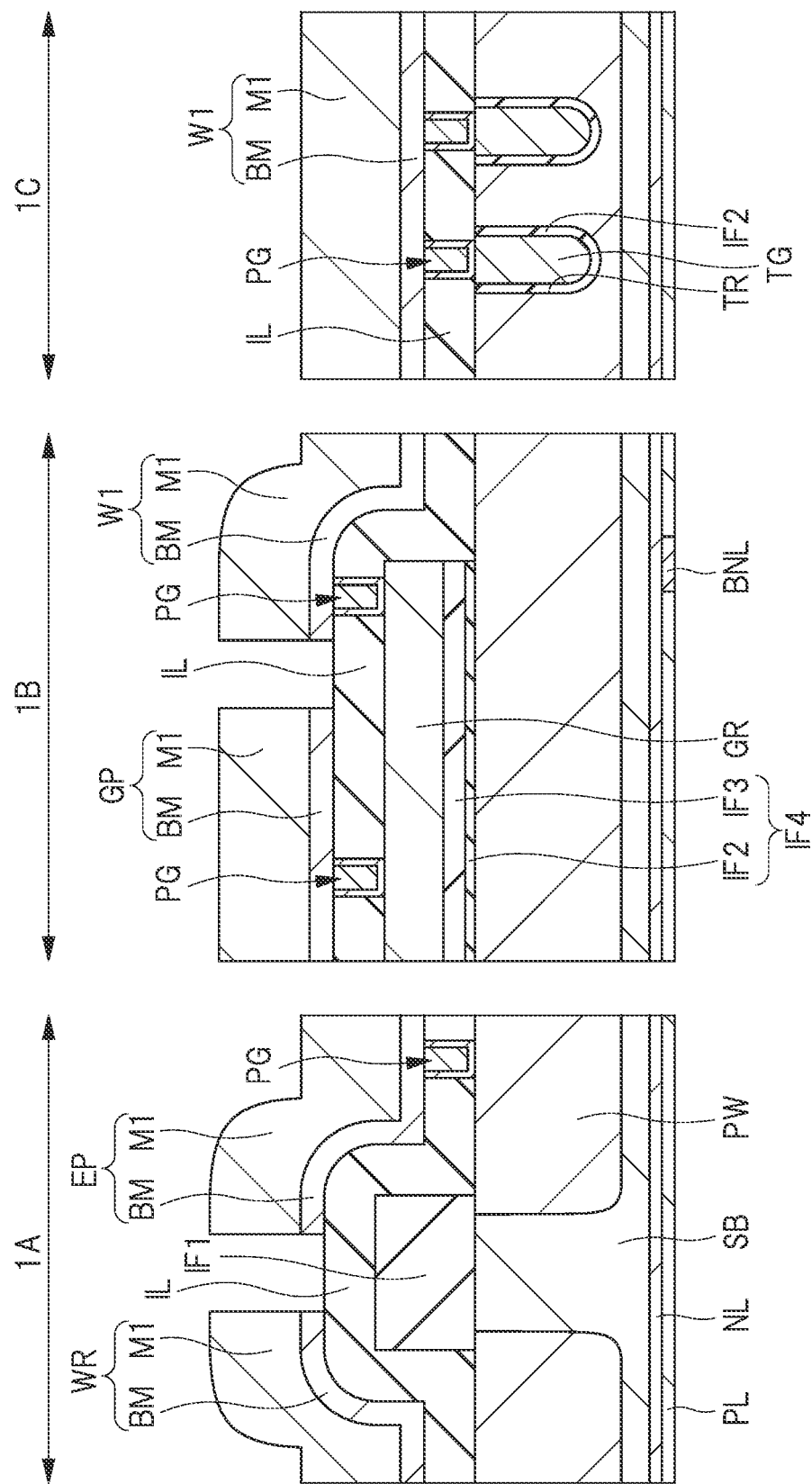
FIG. 13 is a cross-sectional view showing a semiconductor device according to a modification of the embodiment of the present invention.

The present embodiment can be applied also to the semiconductor device having an n type semiconductor layer on the back surface of the semiconductor substrate. FIG. 13 is a cross-sectional view showing a semiconductor device according to a modification. The location shown in FIG. 13 corresponds to the location shown in FIG. 2.

As shown in FIG. 13, the structure of the semiconductor device according to this modification is different from the structure described with reference to FIG. 2 in that the n type semiconductor layer BNL is locally formed on the back surface of the semiconductor substrate SB instead that the p type semiconductor layer PL is uniformly formed on the back surface of the semiconductor substrate SB. Namely, the n type semiconductor layer BNL is formed on the lower surface of the semiconductor substrate SB so as to be adjacent to the p type semiconductor layer PL. The n type semiconductor layer BNL may be intentionally formed in a reverse conducting IGBT (RC-IGBT) or the like, or may be formed as a defect.

In the reverse conducting IGBT, the n type semiconductor layer BNL can be formed by introducing an n type impurity (for example, P (phosphorus)) into the lower surface of the semiconductor substrate SB by the photolithography technique and the ion implantation method after forming the p type semiconductor layer PL.

In the foregoing, the invention made by the inventors has been specifically described based the embodiments, but it is needless to say that the present invention is not limited to the embodiments described above and can be variously modified within the range not departing from the gist thereof.

For example, the material of the semiconductor substrate is not limited to Si, and may be SIC (silicon carbide), GaN (gallium nitride), $Ga_2O_3$ (gallium oxide), or the like.

What is claimed is:

1. A semiconductor device comprising:
   a semiconductor substrate having a first region, a second region, and a third region, the second and third regions being surrounded by the first region in a plan view;
   a p type semiconductor layer formed on a lower surface of the semiconductor substrate;
   an annular first insulating film formed on an upper surface of the semiconductor substrate in the first region to surround the second region and the third region in a plan view;
   a trench formed in the upper surface of the semiconductor substrate in the third region;
   a gate electrode formed in the trench via a second insulating film in the third region;
   a p type semiconductor region formed in the semiconductor substrate in the second region;
   a resistor element formed over the p type semiconductor region on the semiconductor substrate via a third insulating film in the second region, the resistor element being electrically connected to the gate electrode;
   an interlayer insulating film placed on the resistor element in the second region and on the semiconductor substrate in the third region;
   a first plug penetrating from an upper surface of the interlayer insulating film to a lower surface of the interlayer insulating film and formed on an upper surface of the resistor element in the second region;
   a second plug penetrating from the upper surface of the interlayer insulating film to the lower surface of the interlayer insulating film and placed on an upper surface of the gate electrode in the third region, wherein a bottom surface of the second plug covers the upper surface of the gate electrode so that the bottom surface of the second plug and the upper surface of the gate electrode are respectively separated from the upper surface of the semiconductor substrate and the interlayer insulating film while the interlayer insulating film is placed directly above a corner between the semiconductor substrate and an upper end of the trench; and
   a wiring formed on the resistor element in the second region,
   wherein the gate electrode and the resistor element are separated from each other,
   wherein the gate electrode and the resistor element are electrically connected to each other via the first plug, the second plug, and the wiring,
   wherein the gate electrode and the p type semiconductor layer constitute an IGBT, and
   wherein a film thickness of the third insulating film is smaller than a film thickness of the first insulating film and is larger than a film thickness of the second insulating film.

2. The semiconductor device according to claim 1, further comprising:
   a gate pad formed on the resistor element in the second region,
   wherein the resistor element is connected in series between the gate pad and the gate electrode.

3. The semiconductor device according to claim 1 wherein each of the gate electrode and the second plug exposes the upper surface of the semiconductor substrate adjacent to the trench in a direction along the upper surface of the semiconductor substrate.

4. The semiconductor device according to claim 1, wherein the second insulating film is in contact with each of the semiconductor substrate and the gate electrode.

5. The semiconductor device according to claim 4, wherein a shortest distance between a surface of the trench and the gate electrode is 70 nm or more.

6. The semiconductor device according to claim 1, wherein a thickness of the third insulating film is two to seven times a thickness of the second insulating film.

7. The semiconductor device according to claim 1,
   wherein the third insulating film is composed of a fourth insulating film and a fifth insulating film sequentially formed on the semiconductor substrate, and
   wherein a relative dielectric constant of the fourth insulating film is higher than a relative dielectric constant of the fifth insulating film.

8. The semiconductor device according to claim 1,
   wherein an n type semiconductor layer is formed on the lower surface of the semiconductor substrate in addition to the p type semiconductor layer.

* * * * *